(12) United States Patent
Seong et al.

(10) Patent No.: US 7,880,176 B2
(45) Date of Patent: Feb. 1, 2011

(54) TOP-EMITTING LIGHT EMITTING DIODES AND METHODS OF MANUFACTURING THEREOF

(75) Inventors: Tae-Yeon Seong, Gwangju (KR); June-O Song, Gwangju (KR); Kyoung-Kook Kim, Siheung (KR); Woong-Ki Hong, Gwangju (KR)

(73) Assignee: Samsung LED Co., Ltd., Gyeonggi-Do (KR)

( * ) Notice: Subject to any disclaimer, the term of this patent is extended or adjusted under 35 U.S.C. 154(b) by 596 days.

(21) Appl. No.: 11/632,183

(22) PCT Filed: Jul. 22, 2005

(86) PCT No.: PCT/KR2005/002388

§ 371 (c)(1),
(2), (4) Date: Dec. 18, 2007

(87) PCT Pub. No.: WO2006/009413

PCT Pub. Date: Jan. 26, 2006

(65) Prior Publication Data

US 2008/0224165 A1    Sep. 18, 2008

(30) Foreign Application Priority Data

Jul. 23, 2004 (KR) .................... 10-2004-0057569
Jul. 23, 2004 (KR) .................... 10-2004-0057572
Jul. 23, 2004 (KR) .................... 10-2004-0057577
Jul. 23, 2004 (KR) .................... 10-2004-0057587

(51) Int. Cl.
*H01L 33/00* (2010.01)

(52) U.S. Cl. ................... 257/79; 257/13; 257/59; 257/E33.064

(58) Field of Classification Search .................. 257/13, 257/59, 79, E33.064
See application file for complete search history.

(56) References Cited

U.S. PATENT DOCUMENTS 6,287,947 B1    9/2001   Ludowise (Continued)

FOREIGN PATENT DOCUMENTS

EP    0926744 A2    6/1999

(Continued)

OTHER PUBLICATIONS

Office Action dated Oct. 25, 2010 in Corresponding Japanese Patent Application No. 2007-522432 with English Translation.

*Primary Examiner*—Victor A Mandala
(74) *Attorney, Agent, or Firm*—Harness, Dickey & Pierce, PLC

(57) ABSTRACT

Provided are a top-emitting nitride-based light emitting device having an n-type clad layer, an active layer and a p-type clad layer sequentially stacked thereon, comprising an interface modification layer formed on the p-type clad layer and a transparent conductive thin film layer made up of a transparent conductive material formed on the interface modification layer; and a process for preparing the same. In accordance with the top-emitting nitride-based light emitting device of the present invention and a process for preparing the same, there are provided advantages such as improved ohmic contact with the p-type clad layer, leading to increased wire bonding efficiency and yield upon packaging the light emitting device, capability to improve luminous efficiency and life span of the device due to low specific contact resistance and excellent current-voltage properties.

19 Claims, 5 Drawing Sheets

U.S. PATENT DOCUMENTS

| | | | |
|---|---|---|---|
| 7,132,691 B1 * | 11/2006 | Tanabe et al. | 257/79 |
| 7,190,002 B2 * | 3/2007 | Seong et al. | 257/98 |
| 2002/0036286 A1 * | 3/2002 | Ho et al. | 257/11 |
| 2003/0010994 A1 * | 1/2003 | Chen et al. | 257/99 |
| 2003/0127658 A1 * | 7/2003 | Sheu et al. | 257/79 |
| 2005/0224813 A1 * | 10/2005 | Liu et al. | 257/79 |

FOREIGN PATENT DOCUMENTS

| | | | |
|---|---|---|---|
| JP | 09-129919 | * | 5/1997 |
| JP | 9-129919 A | | 5/1997 |
| JP | 10-020320 | | 1/1998 |
| JP | 10-173222 | | 6/1998 |
| JP | 10-215034 | | 8/1998 |
| JP | 2004-207440 A | | 7/2004 |
| KR | 2002-0026737 A | | 4/2002 |

* cited by examiner

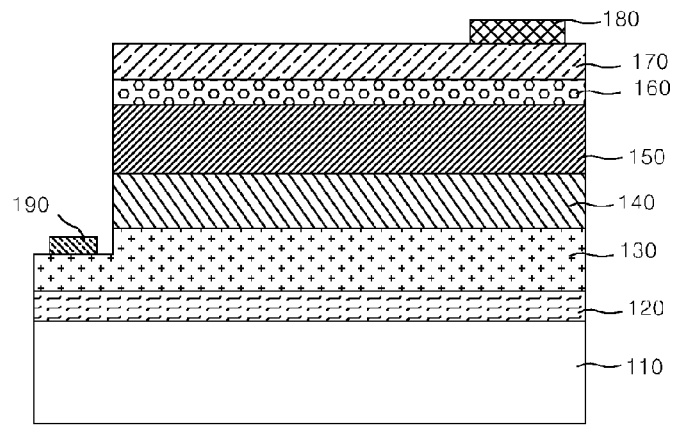
[Fig. 1]
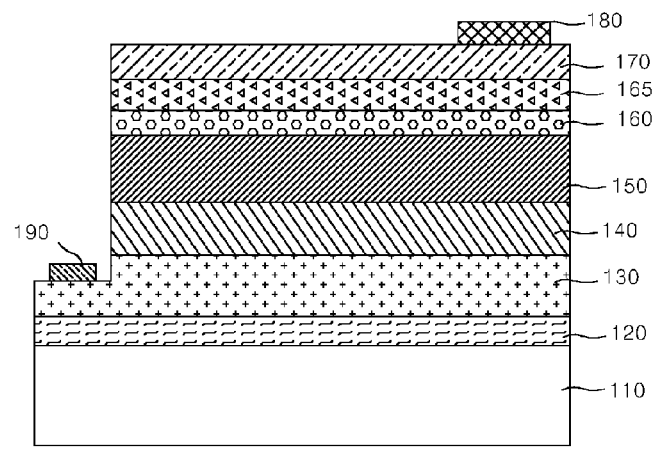
[Fig. 2]
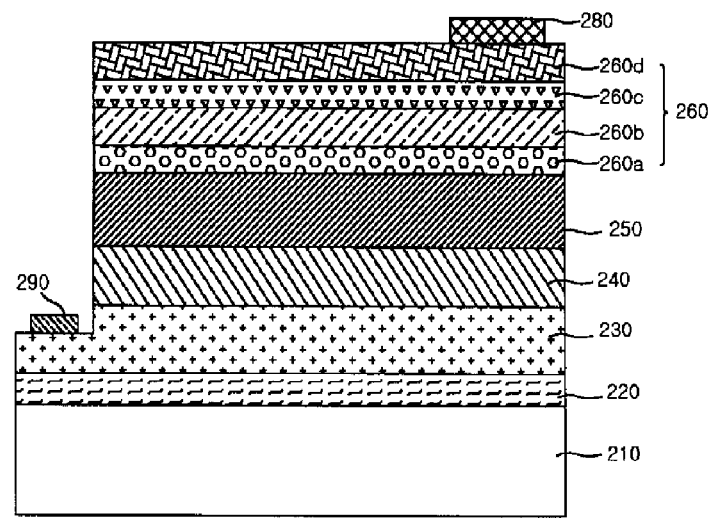
[Fig. 3]

[Fig. 4]
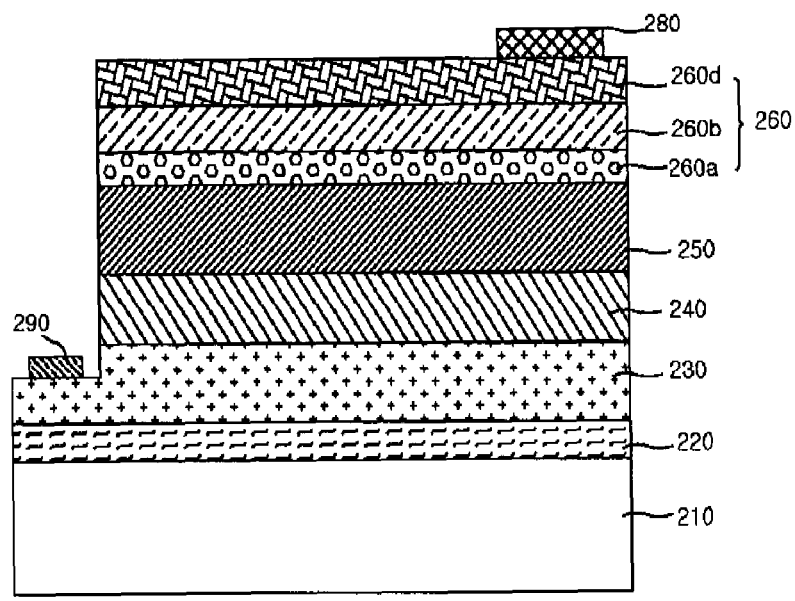
[Fig. 5]
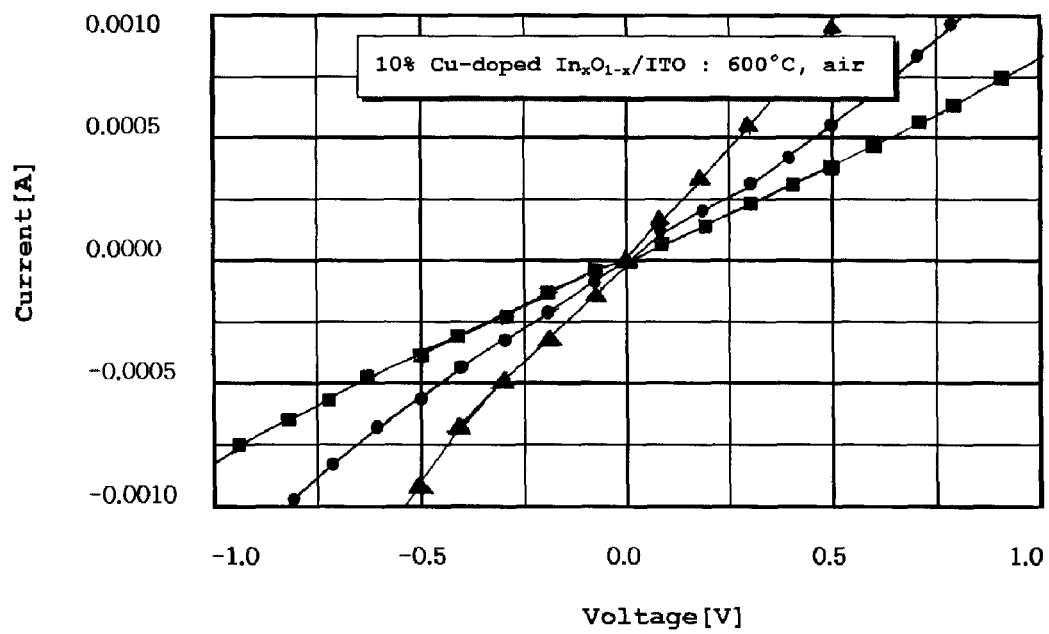

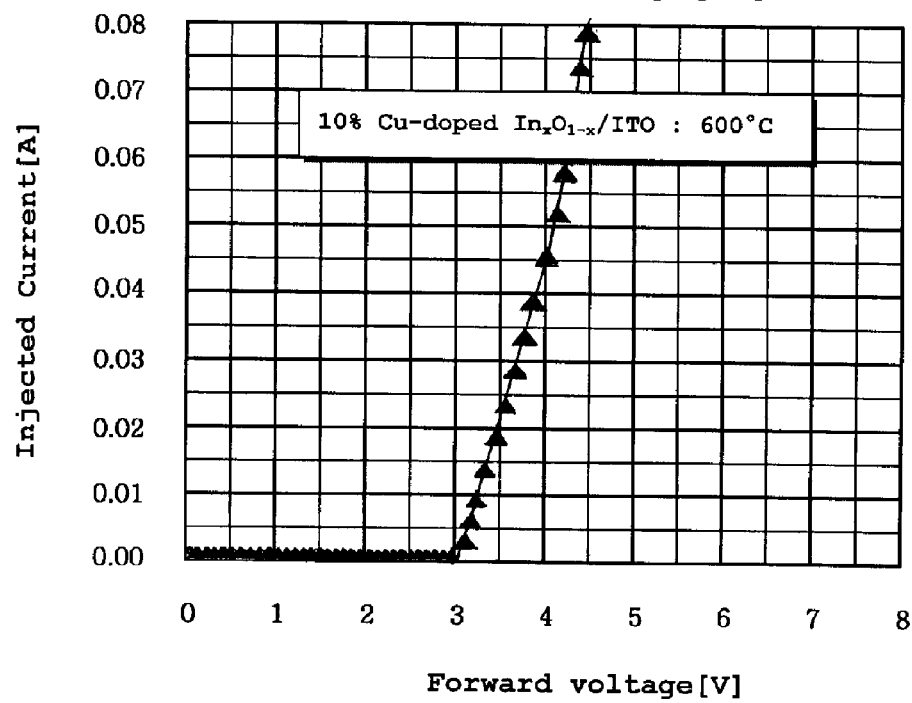
[Fig. 6]
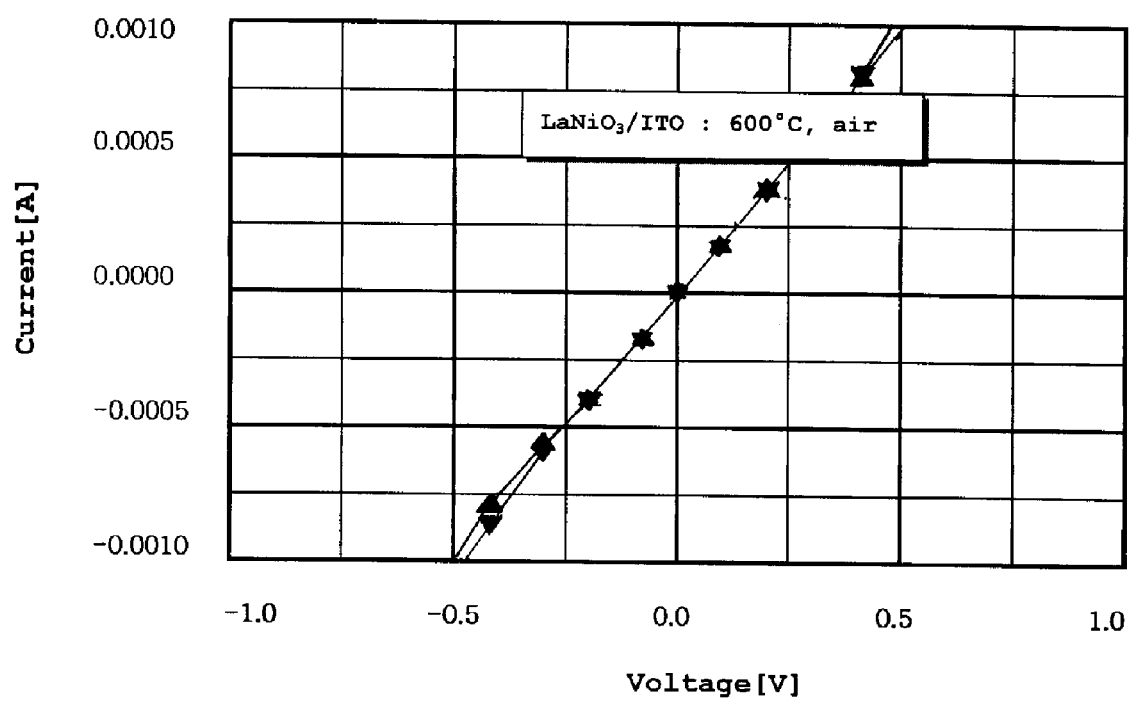
[Fig. 7]

[Fig. 8]
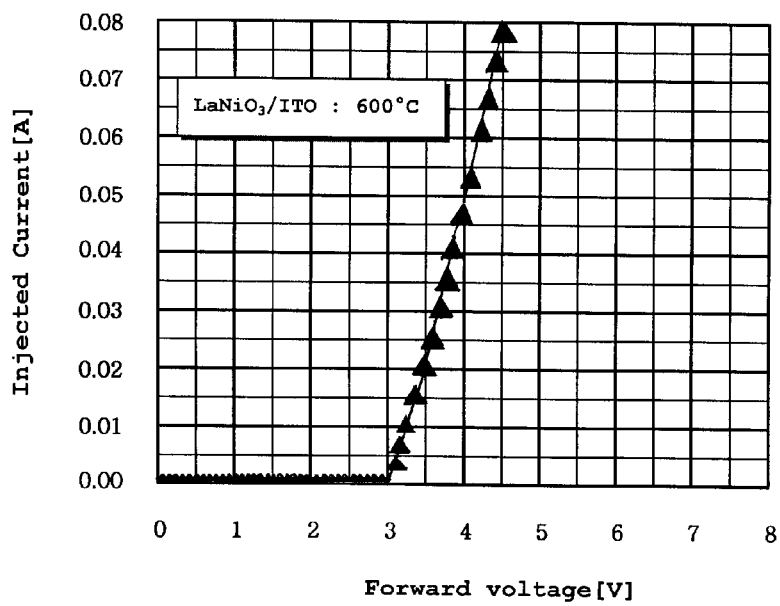
[Fig. 9]
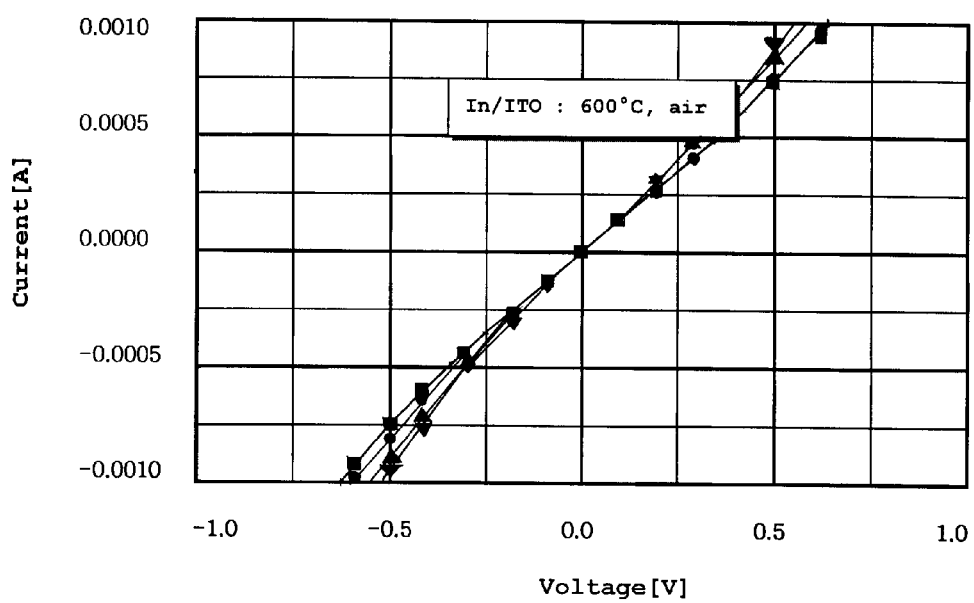

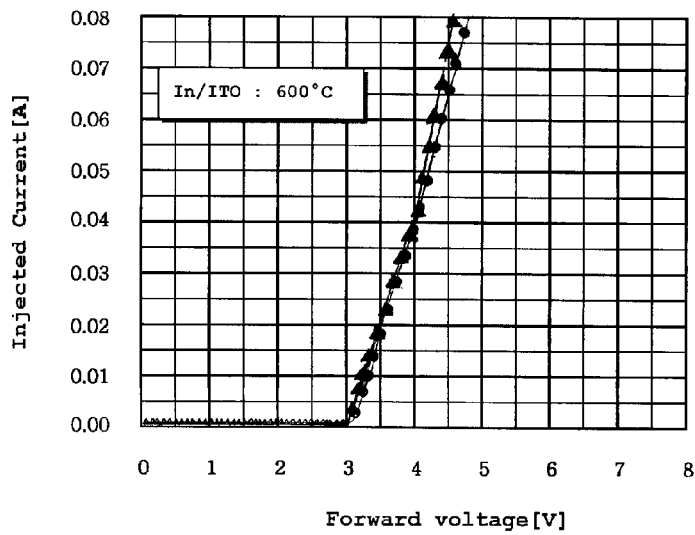
[Fig. 10]
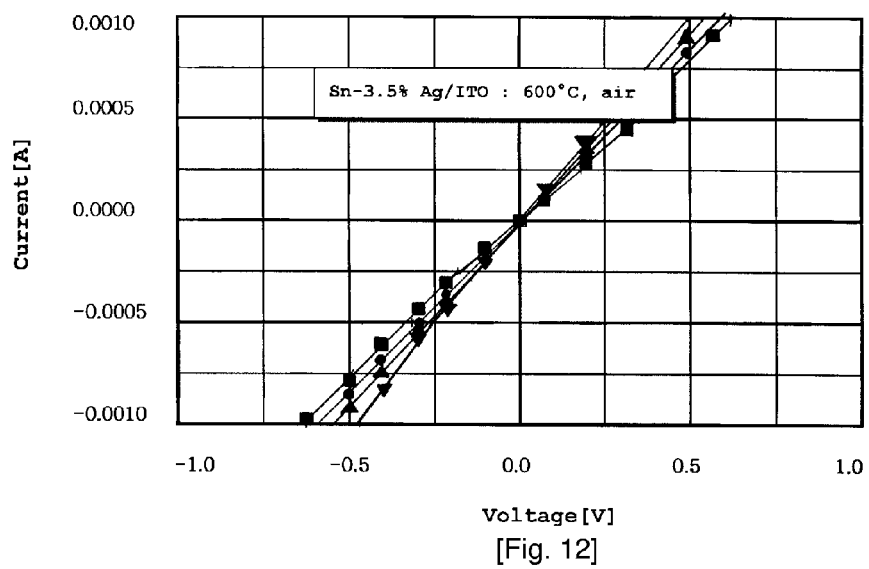
[Fig. 11]
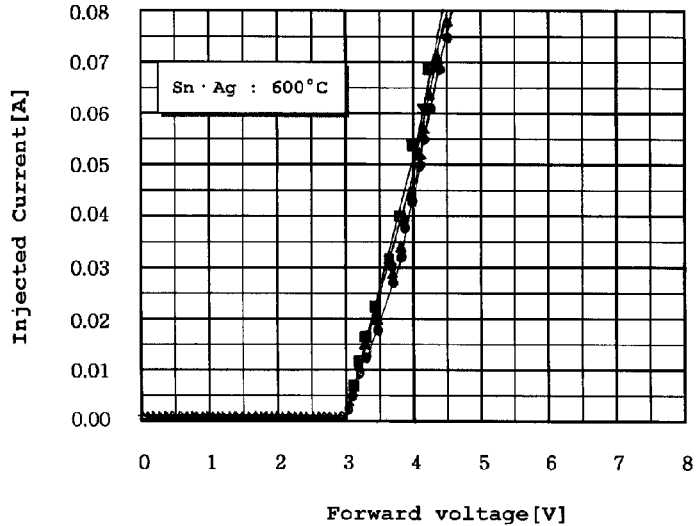
[Fig. 12]

TOP-EMITTING LIGHT EMITTING DIODES AND METHODS OF MANUFACTURING THEREOF

TECHNICAL FIELD

The present invention relates to a top-emitting nitride-based light emitting device and a process for preparing the same. More specifically, the present invention relates to a top-emitting nitride-based light emitting device having improved ohmic characteristics and luminous efficiency and a process for preparing the same.

BACKGROUND ART

Currently, transparent conductive thin films are used for various applications in a variety of fields including photoelectronics, displays and energy industry.

In the area of light emitting devices, development of transparent conductive ohmic electrode structures, which perform functions of smooth hole injection and high-efficiency light emission, is now being actively undertaken throughout the world.

Transparent conductive oxides (TCOs) and transparent conductive nitrides (TCNs) are currently the most actively researched and studied of transparent conductive thin film materials.

The transparent conductive oxides (TCOs) include, for example, indium oxide ($In_2O_3$), tin dioxide ($SnO_2$), zinc oxide (ZnO), and indium tin oxide (ITO). The transparent conductive nitrides (TCNs) include, for example, titanium nitride (TiN).

However, these materials exhibit a relatively high sheet resistance value and reflectivity and a relatively low work function. Therefore, using such materials alone, there is difficulty in application of such materials to p-type transparent ohmic electrodes of top-emitting gallium nitride-based light emitting devices.

To review specific problems associated with use of the above-exemplified thin film materials:

Firstly, since the above-mentioned transparent conductive thin films have high sheet resistance values close to about 100 $\Omega$/unit area, upon forming thin films via Physical Vapor Deposition (PVD) methods such as sputtering, e-beam or heat evaporation, such large resistance characteristics result in difficulty to accomplish current spreading in the horizontal direction of the light emitting device (parallel to layer-layer interfaces) as well as difficulty of smooth hole injection in the vertical direction, thus making it difficult to embody high-brightness light emitting devices having large area and high capacity.

Secondly, since the above-mentioned transparent conductive thin films have high reflectivity and absorptivity for light emitted from gallium nitride-based light emitting diodes, luminous efficiency of diodes formed therefrom is low.

Thirdly, transparent conductive thin films such as indium tin oxide (ITO) and titanium nitride (TiN) have a relatively low work function and thus suffer from difficulty in formation of ohmic contact via direct contact with p-type gallium nitrides.

Finally, when they are applied as electrodes in direct ohmic contact with gallium nitride-based semiconductors, the transparent conductive oxides (TCOs) suffer from difficulty in formation of high quality ohmic contact electrodes due to production of gallium oxide ($Ga_2O_3$), an insulating material, on the surface of gallium nitride layer in the course of thin film formation processes, due to the fact that gallium (Ga) is a powerful oxidant.

Meanwhile, light emitting devices are broadly divided into top-emitting light emitting diodes (TLEDs) and flip-chip light emitting diodes (FCLEDs).

Currently, widely used top-emitting light emitting diodes are configured so as to emit light through an ohmic contact layer in contact with a p-type clad layer. However, in order to implement high-brightness top-emitting light emitting diodes, there is a need for a good-quality current spreading layer to compensate for the high sheet resistance value of the p-type clad layer having a low hole concentration. Therefore, it is necessary to provide functions of smooth hole injection and current spreading and excellent light emission by forming a current spreading thin film layer having a low sheet resistance value and high light-transmittance as the ohmic contact layer.

In top-emitting light emitting diodes known hitherto, the ohmic contact layer in which a nickel (Ni) layer and a gold (Au) layer are sequentially formed on the p-type clad layer is widely used.

Nickel-gold ohmic contact layers are known to have an excellent specific contact resistance of about $10^{-3}$ to $10^{-4}\Omega\square$ and are semi-transparent when annealed under oxygen ($O_2$) atmosphere.

These conventional ohmic contact layers, when annealed at temperatures of about 500 to 600° C. under oxygen ($O_2$) atmosphere, form nickel oxide (NiO), a p-type semi-conductor oxide, between island-like gold layers and on the upper parts thereof, at an interface between gallium nitride constituting the p-type clad layer and the nickel layer applied as the ohmic contact layer, which results in decreased Schottky barrier height (SBH) and thereby easy supply of dominant carrier holes around the surface of the p-type clad layer.

In addition, it is understood that annealing following formation of the nickel-gold layer structure on the p-type clad layer removes Mg—H intermetallic complexes, thus leading to an effective carrier concentration at the surface of the p-type clad layer of more than $10^{18}$ via a reactivation process that increases concentration of magnesium dopants on the surface of gallium nitride which in turn causes inversion of tunneling between the p-type clad layer and nickel oxide-containing ohmic contact layer, thereby providing ohmic conductivity exhibiting low specific contact resistance.

However, the top-emitting light emitting diode utilizing a semi-transparent ohmic contact layer in the form of a nickel-gold structure contains gold (Au) inhibiting light-transmittance and therefore has low luminous efficiency, thus limiting realization of next generation high-capacity, high-brightness light emitting devices.

In addition, even though research and development of flip-chip light emitting diode structures, which emit light through a transparent sapphire substrate by application of a p-type reflective ohmic electrode in order to increase luminous efficiency of light, are now being undertaken, there is difficulty in realization of high quality flip-chip light emitting diodes, due to the absence of an electrically, mechanically and thermally stable p-type reflective ohmic electrode.

In order to overcome limitations exhibited by such top-emitting and flip-chip light emitting diodes, research into utilization of transparent conductive oxides, from which gold (Au) is completely excluded so as to have light-transmittance superior to the semi-transparent nickel (oxide)-gold layer structure that is conventionally used as the p-type ohmic contact layer, for example ITO, are reported in a variety of literature [IEEE PTL, Y. C. Lin, etc. Vol. 14, 1668; and IEEE PTL, Shyi-Ming Pan, etc. Vol. 15, 646]. Recently, realization of the top-emitting light emitting diodes exerting more improved output power compared to conventional nickel-gold structures, via use of ITO ohmic contact layers, is reported in Semicond. Sci. Technol., C S Chang et al, 18 (2003), L21. However, such structures of ohmic contact layers are capable of augmenting luminous efficiency of light emitting devices, but still suffer from problems associated with a relatively high operation voltage, thereby presenting a great deal of limitations in application thereof to high-brightness light emitting devices having a large area and high capacity. On the other hand, U.S. Pat. No. 6,287,947 discloses a method for preparing a light emitting diode having improved light-transmittance and electrical properties via use of an oxidized thin nickel-gold or nickel-silver structure in conjunction with indium tin oxide (ITO). However, the method proposed in the above US Patent has drawbacks such as complicated processes for forming the ohmic contact electrode, and high sheet resistance of ohmic electrodes formed of transition metals including nickel metal or oxides of Group II elements of the Periodic Table and thus difficulty to realize high-efficiency light emitting devices.

Further, oxidized transition metals including nickel exhibit disadvantages of lowered light-transmittance.

There is a great deal of difficulty in development of high quality p-type ohmic electrodes having excellent electrical and optical properties as discussed above, and underlying causes of such difficulty may be summarized as follows:

1. Low hole concentration of p-type gallium nitride and thereby a high sheet resistance value of more than $10^4$ $\Omega$/unit area.

2. Difficulty of smooth hole injection in the vertical direction due to formation of high Schottky barrier height and width at interfaces between p-type gallium nitride and electrodes resulting from the absence of a highly transparent electrode material having a relatively high work function as compared to that of p-type gallium nitride.

3. Reciprocal relationship between electrical properties and optical properties in most materials, and consequently, generally high sheet resistance values of transparent electrodes having high light-transmittance, thereby resulting in sharp decline of current spreading in the horizontal direction.

4. Deterioration in electrical properties of light emitting devices due to production of insulative gallium oxide ($Ga_2O_3$) on the surface of the gallium nitride layer in the course of direct deposition of the transparent conductive thin film layer on the upper part of the p-type gallium nitride.

DISCLOSURE OF INVENTION

Technical Problem

Therefore, the present invention has been made in view of the above problems, and it is an object of the present invention to provide a top-emitting nitride-based light emitting device having excellent electrical properties via application of a high quality ohmic contact electrode having thermal stability and high reliability and a process for preparing the same.

Technical Solution

In order to accomplish the above objects, a top-emitting nitride-based light emitting device having an active layer between an n-type clad layer and a p-type clad layer in accordance with a first embodiment of the present invention comprises an interface modification layer formed on the p-type clad layer; and at least one transparent conductive thin film layer made up of transparent conductive materials formed on the interface modification layer.

A top-emitting nitride-based light emitting device in accordance with a second embodiment of the present invention further comprises an insert metal layer formed between the interface modification layer and transparent conductive thin film layer.

Top-emitting nitride-based light emitting devices having an active layer between an n-type clad layer and a p-type clad layer in accordance with third and fourth embodiments of the present invention comprise a multi-ohmic contact layer including an interface modification layer and at least one transparent conductive thin film layer, as a stack repeat unit, stacked on the p-type clad layer.

In order to accomplish the above objects, a process for preparing a top-emitting nitride-based light emitting device having an active layer between an n-type clad layer and a p-type clad layer, in accordance with the present invention, comprises:

a) forming an interface modification layer on the p-type clad layer of a light emitting structure including the n-type clad layer, active layer and p-type clad layer sequentially stacked on a substrate;

b) forming at least one transparent conductive thin film layer made up of transparent conductive materials on the interface modification layer; and c) annealing the resulting structure.

Preferably, the process may further comprise forming an insert metal layer on the interface modification layer prior to forming the transparent conductive thin film layer.

Further, another process for preparing a top-emitting nitride-based light emitting device having an active layer between an n-type clad layer and a p-type clad layer in accordance with the present invention comprises:

a) forming a multi-ohmic contact layer via stacking an interface modification layer and at least one transparent conductive thin film layer, as a stack repeat unit, on the p-type clad layer of a light emitting structure including the n-type clad layer, active layer and p-type clad layer sequentially stacked on a substrate; and b) annealing the resulting structure.

Advantageous Effects

As described hereinbefore, in accordance with a top-emitting nitride-based light emitting device of the present invention and a process for preparing the same, there are provided advantages such as improved ohmic contact properties with the p-type clad layer, leading to increased wire bonding efficiency and yield upon packaging the light emitting device, capability to improve luminous efficiency and life span of the device due to low specific contact resistance and excellent current-voltage properties.

BRIEF DESCRIPTION OF THE DRAWINGS

The above and other objects, features and other advantages of the present invention will be more clearly understood from the following detailed description taken in conjunction with the accompanying drawings, in which:

FIG. 1 is a cross-sectional view of a light emitting device in accordance with a first embodiment of the present invention;

FIG. 2 is a cross-sectional view of a light emitting device in accordance with a second embodiment of the present invention;

FIG. 3 is a cross-sectional view of a light emitting device in accordance with a third embodiment of the present invention;

FIG. 4 is a cross-sectional view of a light emitting device in accordance with a fourth embodiment of the present invention;

FIG. 5 is a graph showing results of current-voltage properties determined for a p-type electrode structure having copper-doped indium oxide and ITO sequentially stacked thereon;

FIG. 6 is a graph showing results of current-voltage properties determined for a light emitting device to which a p-type electrode structure having copper-doped indium oxide and ITO sequentially stacked thereon is applied;

FIG. 7 is a graph showing results of current-voltage properties determined for a p-type electrode structure having p-type $LaNiO_3$ and ITO sequentially stacked thereon;

FIG. 8 is a graph showing results of current-voltage properties determined for a light emitting device to which a p-type electrode structure having p-type $LaNiO_3$ and ITO sequentially stacked thereon is applied;

FIG. 9 is a graph showing results of current-voltage properties determined for a p-type electrode structure having indium and ITO sequentially stacked thereon;

FIG. 10 is a graph showing results of current-voltage properties determined for a light emitting device to which a p-type electrode structure having indium and ITO sequentially stacked thereon is applied;

FIG. 11 is a graph showing results of current-voltage properties determined for a p-type electrode structure having a 3.5% silver-added tin alloy and ITO sequentially stacked thereon; and FIG. 12 is a graph showing results of current-voltage properties determined for a light emitting device to which a p-type electrode structure having a 3.5% silver-added tin alloy and ITO sequentially stacked thereon is applied.

BEST MODE FOR CARRYING OUT THE INVENTION

Hereinafter, a top-emitting nitride-based light emitting device in accordance with preferred embodiments of the present invention will be described in more detail with reference to the accompanying drawings.

FIG. 1 shows a cross-sectional view of a top-emitting nitride-based light emitting device in accordance with a first embodiment of the present invention.

Referring now to FIG. 1, the top-emitting nitride-based light emitting device is formed of a structure including a substrate 110, a buffer layer 120, an n-type clad layer 130, an active layer 140, a p-type clad layer 150, an interface modification layer 160, and a transparent conductive thin film layer 170 sequentially stacked thereon.

Reference numerals 180 and 190 represent a p-type electrode pad and an n-type electrode pad, respectively.

In addition, the interface modification layer 160 and transparent conductive thin film layer 170 stacked on the p-type clad layer 150 correspond to a multi-ohmic contact layer, i.e., a p-type electrode structure.

The substrate 110 is preferably formed of any one material selected from sapphire ($Al_2O_3$), silicon carbide (SiC), silicon (Si) and gallium arsenide (GaAs).

The buffer layer 120 may be omitted.

Respective layers from the buffer layer 120 to the p-type clad layer 150 are formed on the basis of any one compound selected from compounds represented by a general formula of Group III nitride-based compounds: $Al_xIn_yGa_zN$ ($0 \leq x \leq 1$, $0 \leq y \leq 1$, $0 \leq z \leq 1$, $0 \leq x+y+z \leq 1$). The n-type clad layer 130 and p-type clad layer 150 contain the corresponding dopants added thereto.

The active layer 140 may be configured so as to have a variety of known structures such as a monolayer or an MQW layer.

As an example, where a gallium nitride-based compound semiconductor is applied, the buffer layer 120 is formed of GaN, the n-type clad layer 130 is formed by adding n-type dopants such as Si, Ge, Se and Te to GaN, the active layer 140 is formed of InGaN/GaN MQW or AlGaN/GaN MQW, and the p-type clad layer 150 is formed by adding p-type dopants such as Mg, Zn, Ca, Sr and Ba to GaN.

An n-type ohmic contact layer (not shown) may be interposed between the n-type clad layer 130 and n-type electrode pad 190, and a variety of known structures such as a layer structure having titanium (Ti) and aluminum (Al) sequentially stacked thereon and the like may be applied as the n-type ohmic contact layer.

As the p-type electrode pad 180, a layer structure having nickel (Ni)/gold (Au) or silver (Ag)/gold (Au) sequentially stacked thereon may be applied.

Formation of the respective layers may be carried out via use of an e-beam evaporator, physical vapor deposition (PVD), chemical vapor deposition (CVD), plasma laser deposition (PLD), dual-type thermal evaporator sputtering or the like.

The transparent conductive thin film layer 170 is formed on the interface modification layer 160.

As the material for the transparent conductive thin film layer 170, transparent conductive oxides (TCOs) or transparent conductive nitrides (TCNs) may be applied.

As the transparent conductive oxides, there may be applied combined materials of at least one component selected from indium (In), tin (Sn), zinc (Zn), gallium (Ga), cadmium (Cd), magnesium (Mg), beryllium (Be), silver (Ag), molybdenum (Mo), vanadium (V), copper (Cu), iridium (Ir), rhodium (Rh), ruthenium (Ru), tungsten (W), cobalt (Co), nickel (Ni), manganese (Mn), palladium (Pd), platinum (Pt), and lanthanum (La) with oxygen.

In addition, the transparent conductive nitrides include those nitrides having low sheet resistance and high light-transmittance and containing at least titanium (Ti) and nitrogen (N). As an example, mention may be made of titanium nitride (TiN) or titanium nitride oxide (Ti—N—O).

In order to improve electrical properties, at least one metal element of the Periodic Table, as the dopant, may be added to the transparent conductive oxides or transparent conductive nitrides.

Preferably, a ratio of the dopant, which is added to the transparent conductive oxides or transparent conductive nitrides, is within the range of 0.001 to 20 wt %.

Herein, wt % refers to a weight ratio between materials added.

The material for the transparent conductive thin film layer 170 is selected taking into consideration the work function and sheet resistance depending upon uses of light emitting devices to be applied.

The thickness of the transparent conductive thin film layer 170 is preferably in the range of 1 nm to 1,000 nm so as to have proper light-transmittance and electrical conductivity.

Such a transparent conductive thin film layer 170 preferably takes the form of a monolayer or a multi-layer composed of two or more layers. An example thereof is shown in FIG. 4.

The interface modification layer 160 is applied to improve ohmic contact between the p-type clad layer 150 and transparent conductive thin film layer 170.

As the interface modification layer 160, there are applied materials having electrical conductivity while capable of being easily decomposed into conductive nano-phase oxide particles, or capable of forming the transparent conductive thin film layer, upon annealing at a temperature of less than 800° C. under a variety of gas atmospheres such as oxygen, nitrogen and argon and at the same time, reducing a native oxide layer, i.e., gallium oxide ($Ga_2O_3$), formed thinly on the upper part of the p-type clad layer 150 or converting the gallium oxide layer into a conductive oxide layer.

Materials for the interface modification layer 160 satisfying such conditions can be selected from various materials as below:

1) Any one element selected from indium (In), tin (Sn), zinc (Zn), magnesium (Mg), silver (Ag), iridium (Ir), ruthenium (Ru), rhodium (Rh), platinum (Pt), nickel (Ni) and palladium (Pd), alloys containing at least one selected from the foregoing elements, and solid solutions thereof.

1-1) Materials which are formed of any one of indium among the foregoing elements, alloys to which additional elements are added while containing indium as a main component and solid solutions thereof, are preferred for the interface modification layer. Herein, additional elements added to indium as the material applied to the modification metal layer include at least one selected from tin (Sn), zinc (Zn), gallium (Ga), cadmium (Cd), magnesium (Mg), beryllium (Be), silver (Ag), molybdenum (Mo), vanadium (V), copper (Cu), iridium (Ir), rhodium (Rh), ruthenium (Ru), tungsten (W), cobalt (Co), nickel (Ni), manganese (Mn), palladium (Pd), platinum (Pt) and lanthanum (La). The ratio of the additional element added relative to indium is not particularly limited, but is preferably within the range of 0.001 to 50 wt %.

1-2) Materials which are formed of any one of tin among the foregoing elements, alloys to which additional elements are added while containing tin as a main component and solid solutions thereof, are also preferred for the interface modification layer. Herein, additional elements added to tin as the material applied to the modification metal layer include at least one selected from indium (In), zinc (Zn), gallium (Ga), cadmium (Cd), magnesium (Mg), beryllium (Be), silver (Ag), molybdenum (Mo), vanadium (V), copper (Cu), iridium (Ir), rhodium (Rh), ruthenium (Ru), tungsten (W), cobalt (Co), nickel (Ni), manganese (Mn), palladium (Pd), platinum (Pt) and lanthanum (La). The ratio of the additional element added relative to tin is not particularly limited, but is preferably within the range of 0.001 to 50 wt %.

2) P-type Transparent Conductive Oxides

For the interface modification layer 160, there are applied materials capable of providing a hole concentration of the p-type transparent conductive oxide, formed on the upper part of the p-type clad layer 150, in the range of $10^{15}$ to $10^{18}/cm^3$, such that height and width of the Schottky barrier, which is formed between p-type clad layer 150 and the interface modification layer 160, can be reduced.

2-1) As examples of the p-type transparent conductive oxides, binary or ternary oxides formed of at least one element selected from Group II elements including magnesium (Mg), zinc (Zn) and beryllium (Be) are preferred.

2-2) As examples of the p-type oxides, any one oxide selected from $Ag_2O$, $CuAlO_2$, $SrCu_2O_2$, $LaMnO_3$, $LaNiO_3$ and $In_xO_{1-x}$ is preferred.

P-type dopants may be suitably added to the p-type oxides, such that the concentration and work function of the p-type transparent conductive oxides can be controlled and at the same time, height and width of the Schottky barrier can be reduced.

In addition, besides the above-mentioned p-type transparent conductive oxides, there may be applied a material in which an electron concentration of transparent conductive nano-phase particles or thin film layer formed on the upper part of the p-type clad layer 150 is capable of providing a value of $10^{15}$ to $10^{17}/cm^3$, such that height and width of the Schottky barrier, which is formed between the p-type clad layer 150 and the interface modification layer 160, can be reduced.

2-3) Among the above-mentioned materials, indium-based oxides, tin-based oxides, or zin-based oxides are preferred.

In the case of indium-based oxides, additional elements capable of adjusting the concentration and work function of indium oxide ($In_2O_3$) and simultaneously capable of reducing the height and width of the Schottky barrier are preferably added to indium oxide ($In_2O_3$) that is a main component. As the additional elements, mention may be made of at least one component selected from gallium (Ga), magnesium (Mg), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn) and lanthanum (La).

In the case of tin-based oxides, additional elements capable of adjusting the concentration and work function of tin oxide and at the same time, capable of reducing the height and width of the Schottky barrier are preferably further added to tin oxide. As the additional elements, mention may be made of at least one component selected from zinc (Zn), gallium (Ga), magnesium (Mg), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn) and lanthanum (La).

In the case of zinc-based oxides, additional elements capable of adjusting the concentration and work function of zinc oxide and simultaneously capable of reducing the height and width of the Schottky barrier are preferably further added to zinc oxide. As the additional elements that can be added, mention may be made of at least one component selected from indium (In), tin (Sn), gallium (Ga), magnesium (Mg), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn) and lanthanum (La).

In this connection, the ratio of the additional element added relative to the above-mentioned main components is not particularly limited, but is preferably within the range of 0.001 to 50 wt %. Herein, wt % refers to a weight ratio between materials added.

The interface modification layer 160 made up of the above-mentioned materials is preferably formed to a thickness of 0.1 nm to 100 nm at which the interface modification layer 160 can be easily decomposed into a conductive nano-phase oxide, or is capable of forming a thin film layer through which quantum tunneling of carriers can be effected, upon annealing.

FIG. 2 shows a cross-sectional view of a top-emitting nitride-based light emitting device in accordance with a second embodiment of the present invention. For elements having the same function as in the previously shown drawing, like numbers refer to like elements hereinafter.

Referring now to FIG. 2, the top-emitting light emitting device is formed of a structure including a substrate 110, a buffer layer 120, an n-type clad layer 130, an active layer 140, a p-type clad layer 150, an interface modification layer 160, an insert metal layer 165 and a transparent conductive thin film layer 170 sequentially stacked thereon.

Herein, the interface modification layer 160, insert metal layer 165 and transparent conductive thin film layer 170 correspond to a multi-ohmic contact layer.

The insert metal layer 165 is formed between the interface modification layer 160 and transparent conductive thin film layer 170.

The insert metal layer 165 is preferably made up of a metal that is easily transformed into a transparent conductive oxide upon annealing and, at the same time, is capable of adjusting electrical or optical properties of the modification metal layer 160 or the transparent conductive thin film layer 170 that will be formed on the modification metal layer 160 in a subsequent process.

Preferably, the insert metal layer 165 is formed of at least one component selected from zinc (Zn), indium (In), tin (Sn), nickel (Ni), magnesium (Mg), gallium (Ga), copper (Cu), beryllium (Be), iridium (Ir), ruthenium (Ru) and molybdenum (Mo).

The insert metal layer 165 may of course be formed of multi-layers using the above-enumerated materials.

Preferably, the insert metal layer 165 is formed to a thickness of 1 nm to 100 nm.

Such a light emitting device is fabricated by forming the interface modification layer 160, the insert metal layer 165 and the transparent conductive thin film layer 170 on the p-type clad layer 150 of a light emitting structure including the n-type clad layer 130, active layer 140 and p-type clad layer 150 sequentially stacked on a substrate, via sequential deposition using the previously explained materials and deposition methods, and subjecting the resulting p-type electrode structure to annealing.

Hereinafter, processes for preparing light emitting devices having structures in accordance with the first and second embodiments of the present invention will be described with reference to FIGS. 1 and 2.

Firstly, a buffer layer 120, an n-type clad layer 130, an active layer 140 and a p-type clad layer 150 are sequentially stacked on a substrate 110.

Next, in order to secure a space for formation of an n-type electrode pad 190, a region ranging from the p-type clad layer 150 to the n-type clad layer 130 was partially etched to form a MESA structure.

Then, where the structure of FIG. 1 is applied, an interface modification layer 160 and a transparent conductive thin film layer 170 are sequentially formed on the p-type clad layer 150, and where the structure of FIG. 2 is applied, the interface modification layer 160, an insert metal layer 165 if necessary, and the transparent conductive thin film layer 170 are sequentially formed on the p-type clad layer 150.

The interface modification layer 160/transparent conductive thin film layer 170, or the interface modification layer 160/insert metal layer 165/transparent conductive thin film layer 170 are sequentially formed via use of known deposition methods such as e-beam evaporation, physical vapor deposition (PVD), chemical vapor deposition (CVD), plasma laser deposition (PLD), dual-type thermal evaporator sputtering or the like.

The deposition temperature is in the range of 20° C. to 1500° C. and internal pressure of the evaporator is in the range of atmospheric pressure to $10^{-12}$ torr.

After formation of the interface modification layer 160/transparent conductive thin film layer 170, or the interface modification layer 160/insert metal layer 165/transparent conductive thin film layer 170 on the p-type clad layer 150, the resulting light emitting structure is preferably annealed under vacuum or suitable gas atmosphere.

Annealing is carried out at a temperature of 100° C. to 800° C. in a reactor for 10 sec to 3 hours.

As the gas introduced to the reactor upon annealing, at least one gas selected from nitrogen, argon, helium, oxygen, hydrogen and air may be applied.

FIG. 3 shows a cross-sectional view of a top-emitting light emitting device in accordance with a third embodiment of the present invention. For elements having the same function as in the previously shown drawing, like numbers refer to like elements hereinafter.

Referring now to FIG. 3, the top-emitting light emitting device is formed of a structure including a substrate 210, a buffer layer 220, an n-type clad layer 230, an active layer 240, a p-type clad layer 250 and a multi-ohmic contact layer 260 sequentially stacked thereon. Reference numerals 280 and 290 represent a p-type electrode pad and an n-type electrode pad, respectively.

Hereinafter, the multi-ohmic contact layer 260 will be illustrated.

The multi-ohmic contact layer 260 is formed by repeatedly stacking a modification metal layer 260a/transparent conductive thin film layer 260b as a stack unit. An example of such a repeatedly stacked structure is shown in FIG. 3.

Referring now to FIG. 3, the multi-ohmic contact layer 260 is formed of a structure including the first modification metal layer 260a/first transparent conductive thin film layer 260b/second modification metal layer 260c/second transparent conductive thin film layer 260d sequentially stacked thereon.

The first modification metal layer 260a and first transparent conductive thin film layer 260b may be formed according to the procedure as described for the modification metal layer 160 and transparent conductive thin film layer 170 in the first and second embodiments of the present invention.

Upon annealing, the second modification metal layer 260c is supplied with oxygen from the first transparent conductive thin film layer 260b or from the second transparent conductive thin film layer 260d that will be formed in a subsequent process and form a transparent conductive oxide thin film, and at the same time, further increases carrier concentrations of the first and second transparent conductive thin film layers 260b and 260d.

In order to lower sheet resistance, materials applied to the second modification metal layer 260c may be identical to or different from components of the first modification metal layer 260a.

Preferably, the first and second modification metal layers 260a and 260c are, respectively, formed to a thickness of 0.1 nm to 100 nm at which those layers can be easily decomposed and oxidized into conductive nano-phase particles upon annealing.

In addition, the first transparent conductive thin film layer 260b and second transparent conductive thin film layer 260d may also be formed of the above-mentioned materials, but components of the first transparent conductive thin film layer 260b may be identical to or different from components of the second transparent conductive thin film layer 260d, in order to lower sheet resistance.

The first transparent conductive thin film layer 260b and second transparent conductive thin film layer 260d are also independently formed to a thickness of 1 nm to 1000 nm, as described above.

Such a light emitting device is fabricated by forming the multi-ohmic contact layer 260 via sequential deposition of the first interface modification layer 260a, the first transparent conductive thin film layer 260b, the second interface modification layer 260c and the second transparent conductive thin film layer 260d on the p-type clad layer 250 of a light emitting structure including the n-type clad layer 230, active layer 240 and p-type clad layer 250 sequentially stacked on the substrate 210, using the previously explained materials and deposition methods, and subjecting the resulting structure to annealing.

Meanwhile, FIG. 4 shows a light emitting device to which another multi-ohmic contact layer is applied, as a fourth embodiment of the present invention. For elements having the same function as in the previously shown drawing, like numbers refer to like elements hereinafter.

Referring now to FIG. 4, the multi-ohmic contact layer 260 is formed of a structure including a first modification metal layer 260a/first transparent conductive thin film layer 260b/second transparent conductive thin film layer 260d sequentially stacked thereon. Herein, a stack repeat unit is the first modification metal layer 260a/first transparent conductive thin film layer 260b/second transparent conductive thin film layer 260d.

In the multi-ohmic contact layer 260 having such a structure, the first modification metal layer 260a/first transparent conductive thin film layer 260b/second transparent conductive thin film layer 260d may be formed using the materials and methods as described hereinbefore.

Hereinafter, processes for preparing light emitting devices having structures in accordance with the third and fourth embodiments of the present invention will be described with reference to FIGS. 3 and 4.

Firstly, a buffer layer 220, an n-type clad layer 230, an active layer 240 and a p-type clad layer 250 are sequentially deposited on a substrate 210, thereby forming a light emitting structure.

Next, in order to secure a space for formation of an n-type electrode pad 290, layers from the p-type clad layer 250 to the n-type clad layer 230 are partially etched to form a MESA structure.

Then, a multi-ohmic contact layer 260 is formed on the p-type clad layer 250 of the light emitting structure. The respective layers constituting the multi-ohmic contact layer 260 may be formed via use of known deposition methods such as e-beam evaporation, physical vapor deposition (PVD), chemical vapor deposition (CVD), plasma laser deposition (PLD), a dual-type thermal evaporator sputtering.

In addition, a deposition temperature which is applied for sequential formation of the respective layers of the multi-ohmic contact layer 260 is in the range of 20° C. to 1500° C. and internal pressure of the evaporator is in the range of atmospheric pressure to $10^{-12}$ torr.

Preferably, formation of the multi-ohmic contact layer 260 is followed by an annealing process.

Annealing is carried out at a temperature of 100° C. to 800° C. in a reactor under vacuum or suitable gas atmosphere for 10 sec to 3 hours.

As the gas introduced to the reactor upon annealing, at least one gas selected from nitrogen, argon, helium, oxygen, hydrogen and air may be applied.

FIG. 5 shows determination results of current-voltage properties of the p-type electrode structure manufactured by forming a 3 nm-thick interface modification layer 160 formed by adding 10 wt % of copper (Cu) to indium oxide ($In_xO_{1-x}$) and the transparent conductive thin film layer 170 in which ITO was deposited to a thickness of 200 nm, on the p-type clad layer 150, followed by annealing at 600° C.

The respective graphs in FIG. 5 represent results determined at different distances (4, 8 and 12 micrometers, respectively) between the ohmic electrodes for the thus-manufactured p-type electrode structure. These results show that the current-voltage relationship obeys Ohm s law. That is, as can be seen from FIG. 5, the annealed p-type electrode structure exhibits linear current-voltage characteristics, thus representing ohmic contact, not Schottky contact.

FIG. 6 shows determination results of current-voltage properties of the light emitting device to which a p-type electrode structure is applied, the p-type electrode structure being manufactured by forming a 3 nm-thick interface modification layer 160 formed by adding 10 wt % of copper (Cu) to indium oxide ($In_xO_{1-x}$) and the transparent conductive thin film layer 170 in which ITO was deposited to a thickness of 200 nm, on the p-type clad layer 150 of the light emitting structure, followed by annealing at 600° C.

As can be seen from FIG. 6, a low operation voltage of less than 3.4 volts at injection current of 20 mA is achieved.

FIG. 7 shows determination results of current-voltage properties of the p-type electrode structure manufactured by forming the interface modification layer 160 in which p-type $LaNiO_3$ was deposited to a thickness of 3 nm and the transparent conductive thin film layer 170 in which ITO was deposited to a thickness of 200 nm, on the p-type clad layer 150, followed by annealing at 600° C.

The respective graphs, which were marked by different symbols in FIG. 7, represent results determined at different distances (4 and 8 micrometers, respectively) between ohmic electrodes for the thus-manufactured p-type electrode structure. These results show that the current-voltage relationship obeys Ohm s law. That is, as can be seen from FIG. 7, the annealed p-type electrode structure exhibits linear current-voltage characteristics that represent ohmic contact.

FIG. 8 shows determination results of current-voltage properties of the light emitting device to which the p-type electrode structure is applied, the p-type electrode structure being manufactured by forming the interface modification layer 160 in which p-type $LaNiO_3$ was formed to a thickness of 3 nm and the transparent conductive thin film layer 170 in which ITO was deposited to a thickness of 200 nm, on the p-type clad layer 150 of the light emitting structure, followed by annealing at 600° C., As can be seen from FIG. 8, a low operation voltage of less than 3.4 volts at injection current of 20 mA is achieved.

FIG. 9 shows determination results of current-voltage properties of the p-type electrode structure manufactured by forming the interface modification layer 260a in which indium (In) was deposited to a thickness of 3 nm and the transparent conductive thin film layer 260b in which ITO was deposited to a thickness of 200 nm, on the p-type clad layer 250, followed by annealing at 600° C.

The respective graphs, which were marked by different symbols in FIG. 9, represent results determined at different distances (4, 8, 12 and 16 micrometers, respectively) between ohmic electrodes for the thus-manufactured p-type electrode structure. These results show that the current-voltage relationship obeys Ohm s law. That is, as can be seen from FIG. 9, the p-type electrode structure in accordance with the present invention exhibits linear current-voltage characteristics that represent ohmic contact.

FIG. 10 shows determination results of current-voltage properties of the light emitting device manufactured by forming the first interface modification layer 260a in which indium (In) was deposited to a thickness of 3 nm and the first transparent conductive thin film layer 260b in which ITO was deposited to a thickness of 200 nm, as the p-type electrode structure, on the p-type clad layer 250 of the light emitting structure, followed by annealing at 600° C.

As can be seen from FIG. 10, a low operation voltage of less than 3.4 volts at injection current of 20 mA is achieved.

FIG. 11 shows determination results of current-voltage properties of the p-type electrode structure manufactured by forming a 3 nm-thick modification metal layer 260a formed by adding 3.5 wt % of silver (Ag) to tin (Sn) and the transparent conductive thin film layer 260b in which ITO was deposited to a thickness of 200 nm, on the p-type clad layer 250, followed by annealing at 600° C.

The respective graphs, which were marked by different symbols in FIG. 11, represent results determined at different distances between ohmic electrodes for the thus-manufactured p-type electrode structure. These results show that the current-voltage relationship obeys Ohm s law. That is, as can be seen from FIG. 11, the p-type electrode structure in accordance with the present invention exhibits linear current-voltage properties that represent ohmic contact.

FIG. 12 shows determination results of current-voltage properties of the light emitting device manufactured by forming a 3 nm-thick modification metal layer 260a formed by adding 3.5 wt % of silver (Ag) to tin (Sn) and the transparent conductive thin film layer 260b in which ITO was deposited to a thickness of 200 nm, on the p-type clad layer 250 of the light emitting structure, followed by annealing at 600° C.

As can be seen from FIG. 12, a low operation voltage of less than 3.4 volts at injection current of 20 mA is achieved.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A top-emitting nitride-based light emitting device having an active layer between an n-type clad layer and a p-type clad layer, comprising:
   an interface modification layer formed on the p-type clad layer; and
   a transparent conductive thin film layer made up of a transparent conductive material formed on the interface modification layer,
   wherein the interface modification layer contains a main component selected from an indium-based oxide, a tin-based oxide. or a zinc-based oxide, and an additional element added to the main component to have ohmic contact with the p-type clad layer.

2. The light emitting device according to claim 1, wherein the transparent conductive thin film layer is formed of any one of transparent conductive oxide and transparent conductive nitride.

3. The light emitting device according to claim 2, wherein the transparent conductive oxide contains at least one component selected from indium (In), tin (Sn), zinc (Zn), gallium (Ga), cadmium (Cd), magnesium (Mg), beryllium (Be), silver (Ag), molybdenum (Mo), vanadium (V), copper (Cu), iridium (Ir), rhodium (Rh), ruthenium (Ru), tungsten (W), cobalt (Co), nickel (Ni), manganese (Mn), palladium (Pd), platinum (Pt) and lanthanum (La), and oxygen.

4. The light emitting device according to claim 2, wherein the transparent conductive nitride contains at least titanium (Ti) and nitrogen (N).

5. The light emitting device according to claim 4, wherein the transparent conductive nitride is titanium nitride (TiN) or titanium nitride oxide (Ti—N—O).

6. The light emitting device according to claim 1, wherein the transparent conductive thin film layer is formed to a thickness of 1 nm to 1000 nm.

7. The light emitting device according to claim 1, wherein the interface modification layer is formed of any one element selected from indium (In), tin (Sn), zinc (Zn), magnesium (Mg), silver (Ag), iridium (Ir), ruthenium (Ru), rhodium (Rh), platinum (Pt), nickel (Ni) and palladium (Pd), an alloy containing at least one element selected from the foregoing elements, or a solid solution thereof.

8. The light emitting device according to claim 1, wherein the main component contains indium oxide ($In_2O_3$) and the additional element contains at least one component selected from gallium (Ga), magnesium (Mg), beryllium (Be), molybdenum (Mo), vanadium (V), copper (Cu), iridium (Ir), rhodium (Rh), ruthenium (Ru), tungsten (W), cobalt (Co), nickel mi), manganese (Mn) and lanthanum (La).

9. The light emitting device according to claim 1, wherein the main component contains tin oxide ($SnO_2$) and the additional element contains at least one component selected from zinc (Zn), gallium (Ga), magnesium (Mg), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn) and lanthanum (La).

10. The light emitting device according to claim 1, wherein the main component contains zinc oxide (ZnO) and the additional element contains at least one component selected from indium (In), tin (Sn), gallium (Ga), magnesium (Mg), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn) and lanthanum (La).

11. The light emitting device according to claim 8, wherein the ratio of the additional element added relative to the main component of the interface modification layer is within the range of 0.001 to 50 wt %.

12. The light emitting device according to claim 1, wherein the interface modification layer is formed to a thickness of 0.1 nm to 100 nm.

13. The light emitting device according to claim 1, further comprising:
   an insert metal layer formed between the interface modification layer and transparent conductive thin film layer.

14. The light emitting device according to claim 13, wherein the insert metal layer is formed of at least one component selected from zinc (Zn), indium (In), tin (Sn), nickel (Ni), magnesium (Mg), gallium (Ga), copper (Cu), beryllium (Be), iridium (Ir), ruthenium (Ru) and molybdenum (Mo).

15. The light emitting device according to claim 13, wherein the insert metal layer is formed to a thickness of 1 nm to 100 nm.

16. A top-emitting nitride-based light emitting device having an active layer between an n-type clad layer and a p-type clad layer, comprising:
   a multi-ohmic contact layer including an interface modification layer and at least one transparent conductive thin film layer, as a stack repeat unit, stacked on the p-type clad layer,
   wherein the interface modification layer contains a main component selected from an indium-based oxide, a tin-based oxide. or a zinc-based oxide, and an additional element added to the main component to have ohmic contact with the p-type clad layer.

17. A process for preparing a top-emitting nitride-based light emitting device having an active layer between an n-type clad layer and a p-type clad layer, comprising:
   a) forming an interface modification layer on the p-type clad layer of a light emitting structure including the n-type clad layer, active layer and p-type clad layer sequentially stacked on a substrate;

b) forming at least one transparent conductive thin film layer made up of transparent conductive materials on the interface modification layer; and c) annealing the resulting structure, wherein the interface modification layer contains a main component selected from an indium-based oxide, a tin-based oxide, or a zinc-based oxide, and an additional element added to the main component to have ohmic contact with the p-type clad layer.

18. The process according to claim 17, further comprising:

forming an insert metal layer on the interface modification layer prior to forming the transparent conductive thin film layer.

19. A process for preparing a top-emitting nitride-based light emitting device having an active layer between an n-type clad layer and a p-type clad layer, comprising:

a) forming a multi-ohmic contact layer via stacking of an interface modification layer and at least one transparent conductive thin film layer, as a stack repeat unit, on the p-type clad layer of a light emitting structure including the n-type clad layer, active layer and p-type clad layer sequentially stacked on a substrate; and annealing the resulting structure, wherein the interface modification layer contains a main component selected from an indium-based oxide, a tin-based oxide, or a zinc-based oxide, and an additional element added to the main component to have ohmic contact with the p-type clad layer.

\* \* \* \* \*